US008486196B2

(12) United States Patent
Toda et al.

(10) Patent No.: US 8,486,196 B2
(45) Date of Patent: Jul. 16, 2013

(54) VAPORIZING APPARATUS AND FILM FORMING APPARATUS PROVIDED WITH VAPORIZING APPARATUS

(75) Inventors: Masayuki Toda, Yamagata (JP); Masaki Kusuhara, Tokyo (JP); Masaru Umeda, Tokyo (JP); Mitsuru Fukagawa, Tokyo (JP)

(73) Assignees: Kabushiki Kaisha Watanabe Shoko, Tokyo (JP); Masayuki Toda, Yamagata (JP)

( * ) Notice: Subject to any disclaimer, the term of this patent is extended or adjusted under 35 U.S.C. 154(b) by 390 days.

(21) Appl. No.: 12/601,314

(22) PCT Filed: May 15, 2008

(86) PCT No.: PCT/JP2008/058917
§ 371 (c)(1),
(2), (4) Date: Nov. 23, 2009

(87) PCT Pub. No.: WO2008/146608
PCT Pub. Date: Dec. 4, 2008

(65) Prior Publication Data
US 2010/0173073 A1    Jul. 8, 2010

(30) Foreign Application Priority Data
May 23, 2007    (JP) .................................. 2007-136872

(51) Int. Cl.
*C23C 16/00* (2006.01)
*F01M 11/03* (2006.01)
*B01D 21/24* (2006.01)
*B01D 24/38* (2006.01)
*B01D 29/88* (2006.01)
*B01D 33/70* (2006.01)

(52) U.S. Cl.
USPC ...... 118/726; 210/167.07; 210/109; 210/101; 210/137

(58) Field of Classification Search
USPC .................. 118/726, 727; 210/167.07, 109, 210/101, 137
See application file for complete search history.

(56) References Cited

U.S. PATENT DOCUMENTS 5,958,510 A * 9/1999 Sivaramakrishnam et al. ......................... 427/255.6
6,086,711 A * 7/2000 Kanishak et al. ........ 156/345.29
(Continued)

FOREIGN PATENT DOCUMENTS
JP    2004-273766    9/2004
JP    2005-045170    2/2005
(Continued)

OTHER PUBLICATIONS

International Search Report, PCT/JP2008/058917, Aug. 26, 2008.

*Primary Examiner* — Keath Chen
(74) *Attorney, Agent, or Firm* — Young & Thompson

(57) ABSTRACT

Because an evaporating apparatus for use in an MOCVD film deposition system has a structure in which a plurality of gas passages brings in a gas from the upper direction, the apparatus has a difficulty to position a jet nozzle, and the apparatus is incapable of accurately controlling the pressure and flow rate of a carrier gas mixed with a raw material solution to be issued into an evaporating unit, and it is thus difficult to highly accurately control the composition of MOCVD films. A plurality of gas passages is arranged on a flat, disk-shaped plate. With this configuration, the accurate positioning of the jet nozzle can be made easier, and the composition of MOCVD films can be controlled highly accurately.

13 Claims, 7 Drawing Sheets

U.S. PATENT DOCUMENTS

| | | | |
|---|---|---|---|
| 6,270,839 B1* | 8/2001 | Onoe et al. | 427/248.1 |
| 2006/0037539 A1* | 2/2006 | Toda et al. | 118/726 |
| 2006/0180078 A1 | 8/2006 | Iizuka | |
| 2007/0166457 A1* | 7/2007 | Yamoto et al. | 427/248.1 |
| 2008/0202426 A1* | 8/2008 | Suzuki | 118/726 |

FOREIGN PATENT DOCUMENTS

| | | |
|---|---|---|
| JP | 2005-109348 | 4/2005 |
| JP | 2006-108230 | 4/2006 |
| WO | WO 2004/079806 | 9/2004 |

\* cited by examiner (a)

(b)

VAPORIZING APPARATUS AND FILM FORMING APPARATUS PROVIDED WITH VAPORIZING APPARATUS

TECHNICAL FIELD

The present invention relates to an evaporating apparatus preferably for use in a film deposition system such as an MOCVD system.

BACKGROUND ART

Patent Document 1: International Publication No. WO 2004/079806

To advance the development of next-generation DRAMs, a challenge is to reliably provide the capacity of capacitors while the cell area is decreasing in association with finer design rules. In DRAMs up to 16-Mbit ones, mutilevel structures such as a stack type, a trench type, and a fin type are adopted for the cell structures of capacitors. However, in order to fabricate 256-Mbit DRAMs or above with the use of these mutilevel structure capacitors, problems are an increase in the number of process steps caused by complicated processes and a reduction in yields because of increases in step height. Therefore, in recent years, such studies are proceeding that thin films using high dielectric constant materials such as $Ta_2O_5$, $Y_2O_3$, and $HfO_2$ are used for dielectric films of capacitors. Moreover, as materials having a dielectric constant higher than that of these oxide materials and having expectation for application to DRAMs, $(ba_xSr_{1-x})TiO_3$, $Pb(Zr_yTi_{1-y})O_3$, and $(Pb_aL_{1-a})(Zr_bTi_{1-b})O_3$ are thought as promising ones. In addition, Bi-layer ferroelectric materials having a crystal structure very similar to that of superconducting materials are also hopeful, and in recent years, attention is particularly focused on $SrBi_2TaO_9$ called a Y1 material because of its excellent drive at low voltage and fatigue characteristics. Generally, the formation of an $SrBi_2TaO_9$ ferroelectric thin film is conducted according to practical, promising MOCVD (Metal Organic Chemical Vapor Deposition) methods.

Raw materials for ferroelectric thin films are generally three types of organometallic complexes, $Sr(DPM)_2$, $Bi(C_6H_5)_3$, and $Ta(OC_2H_5)_5$, and each of these complexes is dissolved in a THF (tetrahydrofuran) solvent for use as a liquid solution. In addition, DPM is an abbreviation of dipivaloylmethane.

Their material properties are shown in Table 1.

TABLE 1

| | Boiling point (° C.)/pressure (mmHg) | melting point (° C.) |
|---|---|---|
| $Sr(DPM)_2$ | 242/14 | 78 |
| $Bi(C_6H_5)_3$ | 270 to 280/1 | 201 |
| $Ta(OC_2H_5)_5$ | 146/0.15 | 22 |
| THF | 67 | −109 |

A system used for the MOCVD method is configured of a supplying unit that supplies an $SrBi_2TaO_9$ thin film raw material and an oxidizing agent to a reaction unit, the reaction unit that causes vapor phase reaction and surface reaction on the $SrBi_2TaO_9$ thin film raw material for film deposition, and a collecting unit that collects products generated in the reaction unit. Then, the supplying unit is provided with an evaporating apparatus for evaporating a thin film raw material.

As an evaporating apparatus before, a metal filter evaporating apparatus is known in which a raw material solution heated at a predetermined temperature is dropped onto a metal filter used for the purpose of increasing the contact area between an ambient gas and an $SrBi_2TaO_9$ ferroelectric thin film raw material solution, thereby conducting evaporation. However, in this technique, there is a problem that the metal filter is clogged for several times of evaporation and the filter cannot be used for a long time.

In addition, when the raw material solution is a mixed solution of a plurality of organometallic complexes, a mixed solution of $Sr(DPM)_2$/THF, $Bi(C_6H_5)_3$/THF, and $Ta(OC_2H_5)_5$/THF, for example, and this mixed solution is evaporated by heating, the solvent having the highest vapor pressure (in this case, THF) is first evaporated and the organometallic complexes are deposited and attached on the heating surface, and on this account, such a problem also arises that a raw material cannot be stably supplied to the reaction unit.

As a technique for solving these problems, an evaporating apparatus disclosed in Patent Document 1 is known. This evaporating apparatus is configured of a dispersing unit that has a gas passage provided with a cooling means, the dispersing unit bringing a pressurized carrier gas and a raw material solution into the gas passage for delivering the carrier gas containing the raw material solution to an evaporating unit, and the evaporating unit that heats and evaporates the carrier gas containing the raw material solution delivered from the dispersing unit.

FIG. 8 is a cross section depicting a dispersing unit of an MOCVD evaporating apparatus according to the background technique disclosed in Patent Document 1. An evaporating apparatus 201 according to the background technique is an evaporating apparatus that brings in a carrier gas from one ends of gas passages 206 and 207, and delivers a carrier gas containing a raw material solution from an outlet port 208, which is the other end of the gas passages 206 and 207, to an evaporating unit for evaporation. Mass flow controllers (MFCs) 209 and 210 are provided on one ends of the gas passages 206 and 207, respectively, and manometers 202 and 203 are provided, which are means for detecting pressure inside the gas passages 206 and 207. Pressure inside the gas passage is controlled by the MFC, and pressure inside the gas passage is detected at the same time, whereby clogging in the gas passage can be suppressed and the timing can be informed in advance that dumps are needed to clean.

As shown in FIG. 8, the dispersing unit of the evaporating apparatus according to the background technique is configured of the gas passages 206 and 207 that bring in a carrier gas from the upper direction and solution passages 211 and 212 that bring in a raw material solution from the lateral direction. The raw material solution is issued into the carrier gas in the midway of the gas passage for atomization, the mist is mixed with the carrier gas, the carrier gas is brought together with one in the other passage in the upper part of the outlet port 208, and a plurality of the carrier gases mixed with different raw material solutions is issued into the evaporating unit and heated in the evaporating unit, whereby an MOCVD film is deposited in a depositing unit.

As shown in FIG. 8, the portion in which the raw material solutions in the gas passages are mixed and gases are issued from the outlet port 208 is called a center rod head, in which a rod is provided in the center of the pipe for concentrating and issuing gases, and the gas pipe is tapered at an angle of about 20 degrees. On this account, it is difficult to conduct the position adjustment and centering of the gas passages in the dispersing unit. In addition, the portion at which the solution passage is mounted on the gas passage has a tapered cylindrical surface, and individual evaporating apparatuses are different from each other, and thus it is not easy to conduct accurate control of MOCVD film deposition processing.

In addition, as described above, because the boiling point of the solvent of the raw material solution is lower than the boiling point of the organometallic raw material, it is necessary to cool the dispersing unit in order to prevent clogging caused by the deposit of organic metals. However, in the evaporating apparatus according to the background technique, because the gas passages 206 and 207 and the solution passages 211 and 212 are separate pipes, it is difficult to uniformly cool all the pipes. Therefore, there is still a problem that it is not easy to conduct accurate control of MOCVD film deposition processing. Moreover, it is difficult to increase the number of gas passages, three or four gas passages can be provided at best, and the evaporating apparatus is not ready for the formation of sophisticated MOCVD films using a wide variety of raw materials. In addition, because the evaporating apparatus has the structure in which the gas passages are arranged in the upper part, such a problem also arises that the height of the evaporating apparatus becomes higher to increase the apparatus size.

DISCLOSURE OF THE INVENTION

Problems that the Invention is to Solve

It is an object of the present invention to provide an MOCVD evaporating apparatus that is capable of improving the processing accuracy of members for gas passages in a dispersing section and capable of uniformly cooling a carrier gas mixed with a raw material solution at high cooling efficiency.

Means for Solving the Problems

A present invention (1) is an evaporating apparatus for bringing in a carrier gas from one end of a gas passage and delivering a carrier gas containing a raw material solution from an issuing part arranged at the other end of the gas passage to an evaporating unit for evaporation, the apparatus characterized in that a plurality of the gas passages is radially arranged on a flat plate around the issuing part.

A present invention (2) is the evaporating apparatus according to the invention (1), characterized in that the shape of the lower portion of the issuing part is a conical shape projecting downward, and a passage carrying the carrier gas containing a raw material solution therethrough and a packing member are alternately arranged on the slope of the cone.

A present invention (3) is the evaporating apparatus according to the invention (1) or the invention (2), characterized in that a cooling means for cooling the gas passage is provided.

A present invention (4) is the evaporating apparatus according to the invention (3), characterized in that a cooling temperature by the cooling means ranges from 0° C. to 35° C.

A present invention (5) is the evaporating apparatus according to the invention (1) to the invention (4), characterized in that the gas passage has a plurality of bends on the flat plate.

A present invention (6) is a film deposition system having the evaporating apparatus according to any one of the invention (1) to the invention (5).

A present invention (7) is the film deposition system according to the invention (6), characterized in that the film deposition system is an MOCVD system.

A present invention (8) is an evaporation method of bringing in a carrier gas from one end of a gas passage and delivering a carrier gas containing a raw material solution from an issuing part connected to the other end of the gas passage to an evaporating unit for evaporation, the method characterized by including the step of delivering the carrier gas containing a raw material solution to the evaporating unit through a plurality of the gas passages radially arranged on a flat plate around the issuing part.

A present invention (9) is the evaporation method according to the invention (8), characterized in that the carrier gas containing a raw material solution is delivered to the evaporating unit through the gas passages and the issuing part cooled at temperatures ranging from 0° C. to 35° C.

A present invention (10) is a film deposition method characterized in that evaporation is conducted for film deposition in accordance with the evaporation method according to any one of the invention (8) to the invention (9).

A present invention (11) is the film deposition method according to the invention (10), characterized in that the film deposition method is an MOCVD method.

Advantage of the Invention

According to the present invention (1), passages for bringing in a raw material are arranged on the flat plate, whereby advantages are exerted that the processing and positioning accuracy of the passages for bringing in a raw material is improved, and sealing efficiency is enhanced. In addition, the passages for bringing in a raw material are radially arranged on the flat plate, whereby the number of the gas passages can be increased freely. Moreover, the passages for bringing in a raw material are arranged on the flat plate, whereby the height of the overall MOCVD system can be lowered. The system can be installed in a clean room with the limitation of height, and the efficiency of use of space is improved.

According to the present invention (2), advantages can be exerted that the processing and positioning accuracy of a plurality of the gas outlet ports is improved, sealing efficiency is enhanced, and the efficiency of assembly work and maintenance efficiency are raised.

According to the present invention (3), advantages can be exerted that the cooling efficiency and cooling uniformity of a raw material are improved, and the controllability of raw material temperatures is enhanced. A plurality of liquid raw materials is mixed just near a cooling section and a jet nozzle, and atomized and issued into the evaporating unit, whereby materials having different evaporation properties are instantaneously evaporated and supplied to a reactor, and thus the growth of a plurality of the raw materials can be made easier, and the controllability and reproducibility of compositions can be improved.

According to the present invention (4), a raw material can be prevented from being deposited, and a gas jet nozzle can be prevented from being clogged.

According to the present invention (5), the passage for bringing in a raw material is bent freely, whereby a secondary swirl flow is induced in the passage to cause the flowing state of a gas-liquid two phase flow to be a more turbulent flow for promotion of making finer liquid particles in the passage. In addition, the cooling efficiency of the fluid is also improved. Moreover, it is also possible that pressure in the passage is increased, and the occurrence of bubbles in the gas-liquid two phase flow is prevented to further stabilize the flow. A plurality of liquid materials is issued into individual high-speed carrier gas passages, and the raw materials are sheared to be fine particles and changed into a mixed gas just near the nozzle for issuing the gas into the evaporating unit, whereby mixing and evaporation can be conduced in a single evaporating apparatus.

According to the present invention (6), the stoichiometry, impurity contents, and composition of a film to be deposited can be controlled highly accurately. In addition, the system is capable of meeting the production of films of more complicated chemical formulas using a large number of different raw materials.

According to the present invention (7), the stoichiometry, impurity contents, and composition of an MOCVD film to be deposited can be controlled highly accurately. In addition, the system is capable of meeting the production of MOCVD films of more complicated chemical formulas using a large number of different raw materials.

According to the present invention (8), the passages for bringing in a raw material are arranged on the flat plate, whereby advantages are exerted that the processing and positioning accuracy of the passages for bringing in a raw material is improved, and sealing efficiency is enhanced. In addition, the passages for bringing in a raw material are radially arranged on the flat plate, whereby the number of the gas passages can be increased freely. Moreover, the passages for bringing in a raw material are arranged on the flat plate, whereby the height of the overall MOCVD system can be lowered. The system can be installed in a clean room with the limitation of height, and the efficiency of use of space is improved.

According to the present invention (9), advantages can be exerted that the cooling efficiency and cooling uniformity of a raw material are improved, and the controllability of raw material temperatures is enhanced. In addition, a raw material can be prevented from being deposited, and clogging in the gas passages and in the gas issuing part can be prevented.

According to the present invention (10), the stoichiometry of a film to be deposited can be controlled highly accurately. In addition, the method is capable of meeting the production of films of more complicated chemical formulas using a large number of different raw materials. The method is capable of meeting demands for deposition of diverse thin films, for example, formation of a multilayer film of high dielectric constant thin film/low dielectric constant thin film/ferroelectric thin film, various electrode films, various buffer films, and a multilayer film of individual element films.

According to the present invention (11), the stoichiometry, impurity contents, and composition of an MOCVD film to be deposited can be controlled highly accurately. In addition, the method is capable of meeting the production of MOCVD films of more complicated chemical formulas using a large number of different raw materials.

Figure 1:
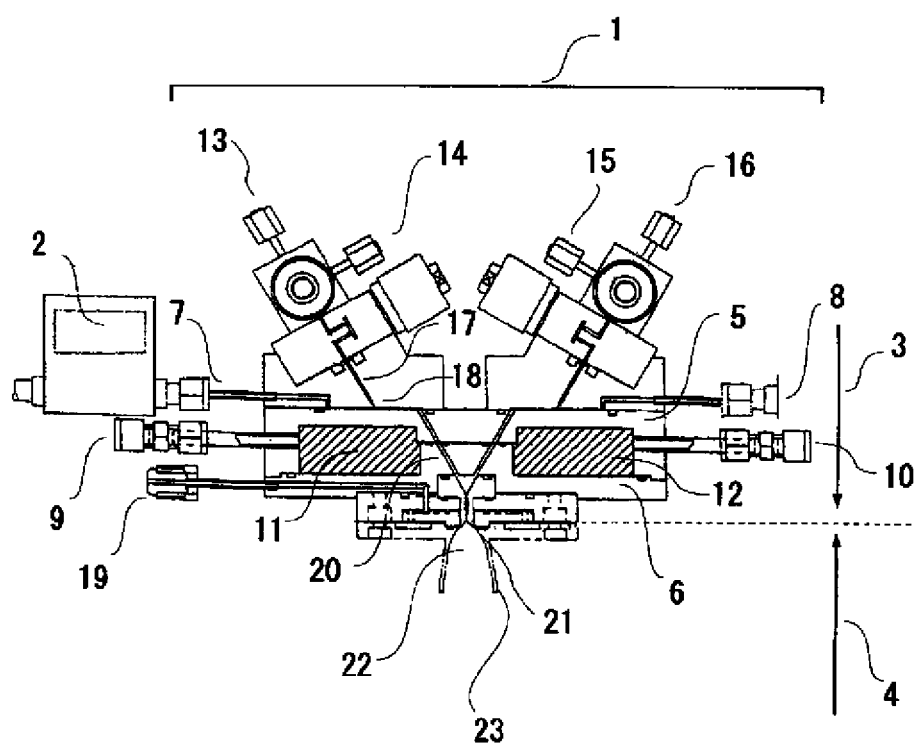
[FIG. 1] It is a cross section partially depicting an evaporating apparatus according to a specific embodiment of the present invention.

| Description of Reference Numerals and Signs | |
|---|---|
| 1: | evaporating apparatus |
| 2: | manometer |
| 3: | evaporating head |
| 4: | evaporating unit |
| 5, 40: | integrated plate |
| 6, 41: | cooling plate |
| 7, 8, 54, 55: | primary carrier gas inlet port |
| 9, 10, 56, 57: | cooling water inlet port |
| 11, 12: | cooling water passage |
| 13, 16, 33: | raw material solution inlet port |
| 14, 15, 34: | solvent and purge gas inlet port |
| 17, 47: | raw material discharge port |
| 18, 20, 49, 50, 51: | gas-solution mixing channel |
| 19, 58: | secondary carrier gas inlet port |
| 21: | jet nozzle |
| 22: | atomizing and issuing part |
| 23: | upper evaporating pipe |
| 31, 32: | three-way diverter valve |
| 35: | three-way valve connecting port |
| 36, 37, 38: | valve |
| 39: | gas-liquid mixing plate |
| 42: | mixture spray nozzle |
| 43: | intermediate plate |
| 44: | secondary carrier plate |
| 45: | atomizing jet nozzle |
| 46: | heat insulating spatial layer |
| 48: | gas passage |
| 52, 53: | positioning pin |
| 61: | circular integrated plate |
| 62, 63, 64, 65: | three-way diverter valve |
| 66: | primary carrier gas inlet port |
| 67: | cooling water inlet port |
| 68: | cooling water outlet port |
| 69: | solvent and purge gas inlet port |
| 70: | raw material solution inlet port |
| 71: | secondary carrier gas inlet port |
| 81, 94: | evaporating head unit |
| 82, 95: | evaporating unit |
| 83: | upper evaporating pipe |
| 84: | lower evaporating pipe |
| 85, 96: | three-way diverter valve |
| 86, 97: | primary carrier gas inlet port |
| 87, 98: | secondary carrier gas inlet port |
| 88, 100: | evaporating pipe |
| 89: | incorporated heater |
| 90, 99: | cooling water passage |
| 91, 92, 93: | evaporating apparatus |
| 101, 108: | integrated plate |
| 102, 109: | gas-solution mixing channel |
| 103, 110: | carrier gas inlet port |
| 104, 111: | raw material solution inlet port |
| 105, 112: | issuing part |
| 106a, 106b, 113, 115: | cooling water inlet port |
| 107, 114: | positioning pin |
| 121: | mixture spray nozzle |
| 122: | gas-solution mixing channel |
| 123: | cooling plate |
| 124: | conical mixing part |
| 125: | O-ring seal |
| 126: | jet nozzle |
| 127: | secondary carrier nozzle |
| 128: | upper evaporating pipe |
| 201: | evaporating apparatus |
| 202, 203: | manometer |
| 204, 205: | carrier gas |
| 206, 207: | gas passage |
| 208: | outlet port |
| 209, 210: | MFC |
| 211, 212: | solution passage |

-continued

| | Description of Reference Numerals and Signs |
|---|---|
| 213: | raw material solution and cleaning liquid inlet port |
| 214: | raw material solution valve |
| 215: | cleaning liquid valve |

BEST MODE FOR CARRYING OUT THE INVENTION

Hereinafter, the best mode according to the present invention will be described.

(Specific Embodiment of an Evaporating Apparatus)

Figure 2:
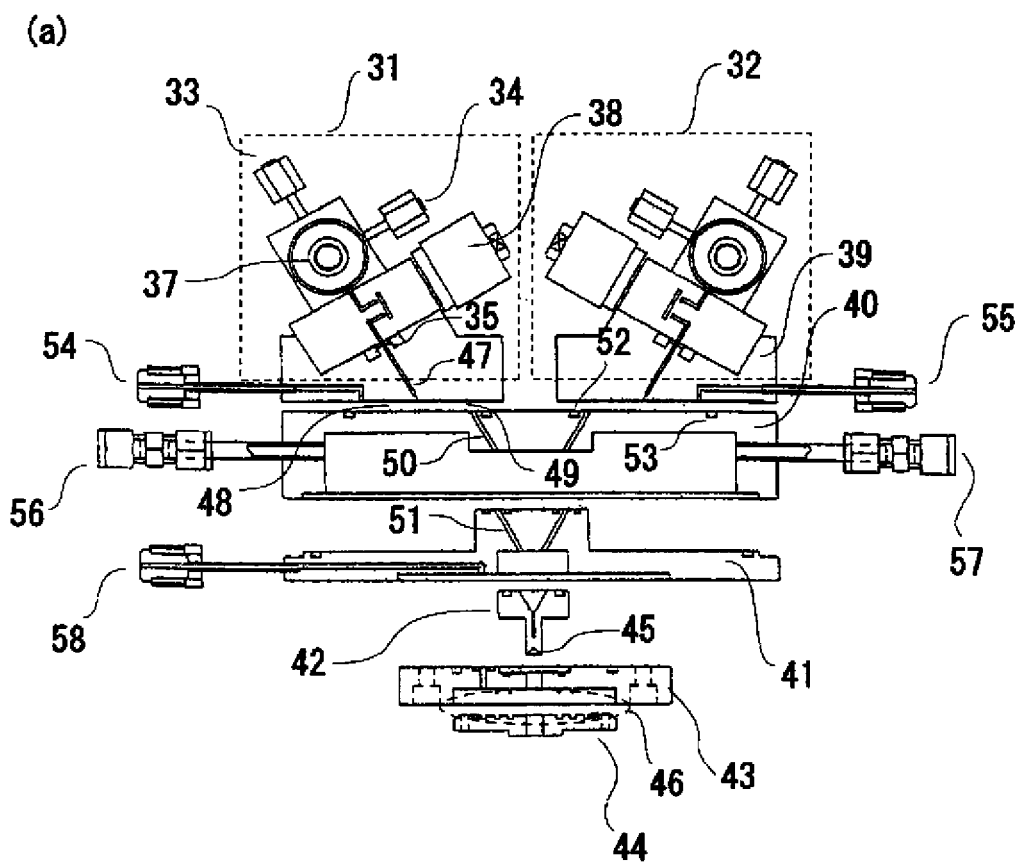
[FIG. 2] (*a*) is a cross section partially depicting the evaporating apparatus according to a specific embodiment of the present invention in the exploded state, and (*b*) is a schematic diagram depicting a three-way diverter valve.
Figure 2:
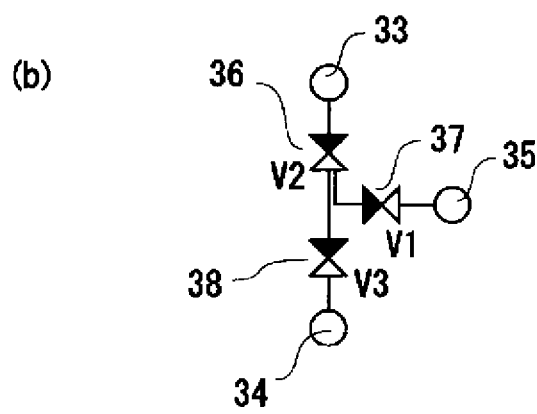

FIG. 1 is a cross section partially depicting an evaporating apparatus according to a specific embodiment of the present invention. FIG. 2(a) is a cross section partially depicting the evaporating apparatus according to a specific embodiment of the present invention in the exploded state. The evaporating apparatus according to this embodiment is configured of an evaporating head 3 that has a gas passage provided with a cooling means in which a pressurized carrier gas and a raw material solution are brought into a gas passage to deliver the carrier gas containing the raw material solution to an evaporating unit, and the evaporating unit 4 that heats the carrier gas containing the raw material solution delivered from the evaporating head 3 for evaporation. The evaporating apparatus shown in FIG. 1 is fabricated by assembling members shown in FIG. 2. FIG. 2(b) is a schematic diagram depicting a three-way valve shown in FIG. 2(a).

The evaporating apparatus according to the present invention is an apparatus characterized in the structure of a dispersing section in that a carrier gas is brought in from one end of the gas passage, a raw material solution is issued into the carrier gas in the midway of the gas passage, the carrier gas shears the raw material solution to change the raw material solution in mist (fine particle state) for dispersing the solution in the carrier gas, and the carrier gas containing the raw material solution in fine particles (raw material solution dispersed gas) is delivered from an issuing part arranged at the other end of the gas passage to the evaporating unit for heating and evaporation, and a plurality of the gas passages is radially arranged on a flat plate around the issuing part.

Figure 6:
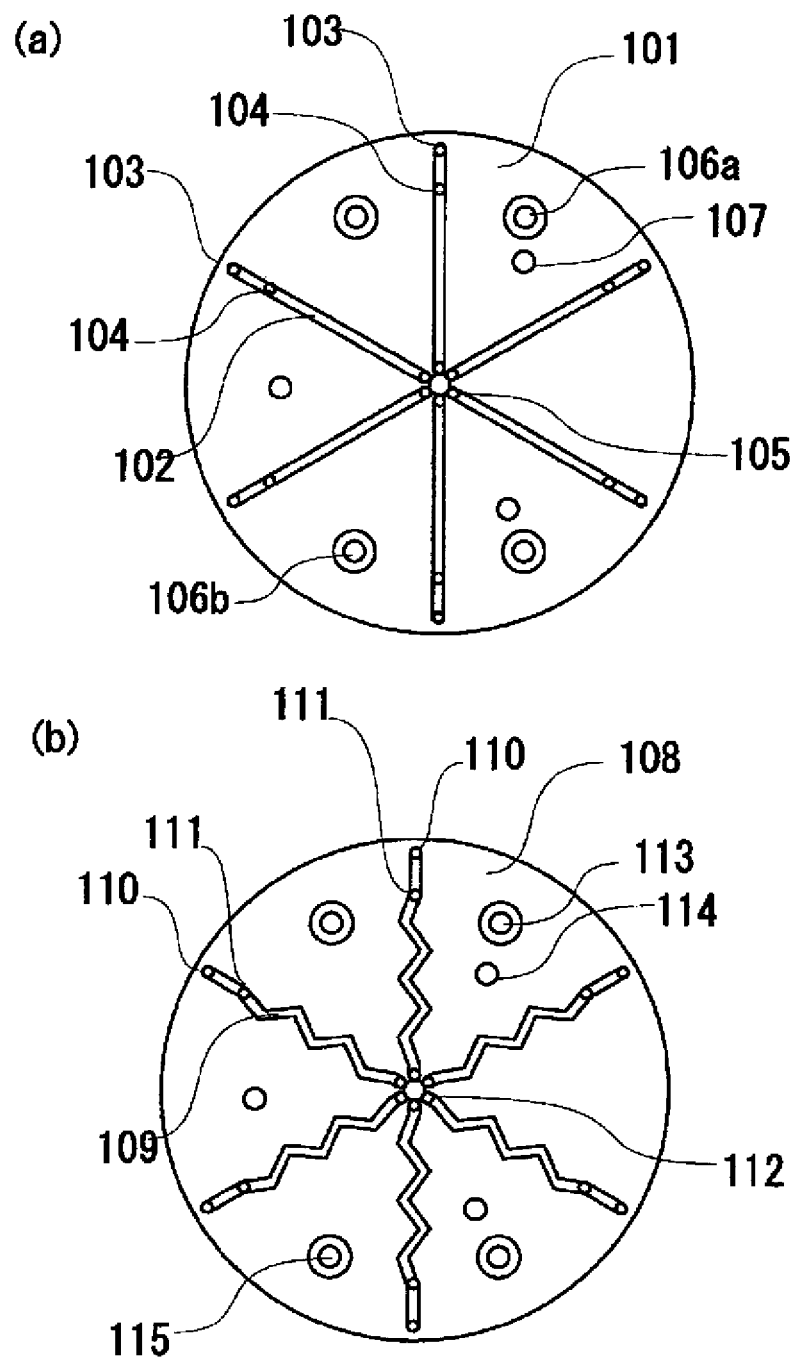
[FIGS. 6] (*a*) and (*b*) are plan views depicting a circular integrated plate of the evaporating apparatus according to a specific embodiment of the present invention.

The evaporating head 3 has a gas-solution mixing channel (gas passage) 18 formed by laying three-way diverter valves 31 and 32 on an integrated plate 5. FIG. 6(a) is a plan view depicting the integrated plate 5 shown in FIG. 1 seen from above. A flat plate (integrated plate) 101 shown in FIG. 6(a) is a disk-shaped plate radially having six straight gas passages 102 arranged around an issuing part 105 for a raw material solution dispersed gas. In the integrated plate 101, the issuing part 105 is processed and formed as holes penetrating through the plate, and the gas-solution mixing channel 102 is processed and formed as a groove part on the surface of the integrated plate 101. Therefore, the gas-solution mixing channel can be also processed with high processing accuracy and positioning accuracy with the use of general processing methods. After that, as shown in FIG. 1, three-way diverter valves are laid on the integrated plate 5. For the alignment of the three-way diverter valve with the integrated plate 5, a positioning pin is in advance formed at a suited position and a recessed part for fitting is formed at the position corresponding to the positioning pin, whereby the plate is only fit in an assembly process to allow accurate positioning. Although not shown in the drawing, a sealing member is suitably provided between the three-way diverter valve and the integrated plate, whereby a carrier gas can be prevented from leaking out from the gas-solution mixing channel formed by laying the three-way diverter valve on the integrated plate.

At one end of the gas-solution mixing channel 102, a carrier gas inlet port 103 is arranged on the side surface of the flat plate to have supply of a carrier gas (for example, $N_2$, Ar, and He), whose flow rate and pressure are controlled, from a carrier gas supplying unit, not shown. A pressure detecting device, not shown, is provided on the gas passage to monitor carrier gas pressure, whereby the timing can be informed in advance that maintenance is necessary to prevent the gas passage from being clogged.

In addition, preferably, the cross sectional area of the gas passage ranges from 0.10 to 0.50 $mm^2$. Processing is difficult to conduct when the area is below 0.10 $mm^2$. When the area exceeds 0.50 $mm^2$, a necessity arises that a high-pressure carrier gas is used at a large flow rate in order to flow a carrier gas at high speed. When a carrier gas is used at a large flow rate, a large vacuum pump of large capacity is required in order to keep a reaction chamber at a reduced pressure (for example, 1.0 Torr). Because it is difficult to adopt a vacuum pump having an exhaust capacity over 10,000 l/min (at a pressure of 1.0 Torr), in order to aim at industrial commercial use, the cross sectional area of the gas passage preferably ranges from 0.10 to 0.50 $mm^2$ for carrying a carrier gas at a suited flow rate.

The number of gas passages is not limited to six passages. The number of gas passages may be below or above six passages. Because the gas passage can be processed and formed as a groove on the flat plate, the gas passage can be formed with high processing accuracy and position accuracy even though the number of the gas passages is increased. It is also possible that grooves are formed on a plurality of plates for laying the plates on each other, and in this case, a large number of gas passages can be formed.

On a cooling plate 6 adjacent to the integrated plate 5 forming the gas-solution mixing channel 18, a cooling means is provided near the gas-solution mixing channel 18. In the specific embodiment shown in FIG. 1, a cooling water passage 11 for carrying cooling water through the passage is formed in the plate. Because the inside of the gas-solution mixing channel 18 of the evaporating head 3 is affected by heat caused by a heater of the evaporating unit 4, such a problem arises that when a raw material solution dispersed gas is heated in the gas-solution mixing channel 18, the solvent of the raw material solution and an organometallic complex are not evaporated at the same time but only the solvent is evaporated, a raw material is deposited in the gas-solution mixing channel 18 to clog the passage. Then, a raw material solution dispersed gas flowing through the gas-solution mixing channel 18 is cooled to prevent the event that only the solvent is evaporated. Particularly, it is important to cool the gas passage on the downstream side from a raw material discharge port 17. Moreover, because a gas-solution mixing channel 20 near a jet nozzle 21 is a portion greatly affected by heat caused by the heater in particular, it is necessary to sufficiently cool that portion. Preferably, the cooling temperature is between the freezing point and boiling point of the solvent, both inclusive. For example, preferably, the temperature is between temperatures of 0° C. and 35° C., both inclusive. Cooling the gas passage can prevent the occurrence of a blockage because of carbides in the gas passage (particularly at the gas outlet port) even in a long time use. The cooling means is not limited to cooling by cooling water, and cooling can be conducted by using other cooling means such as a Peltier element, for example.

Figure 4:
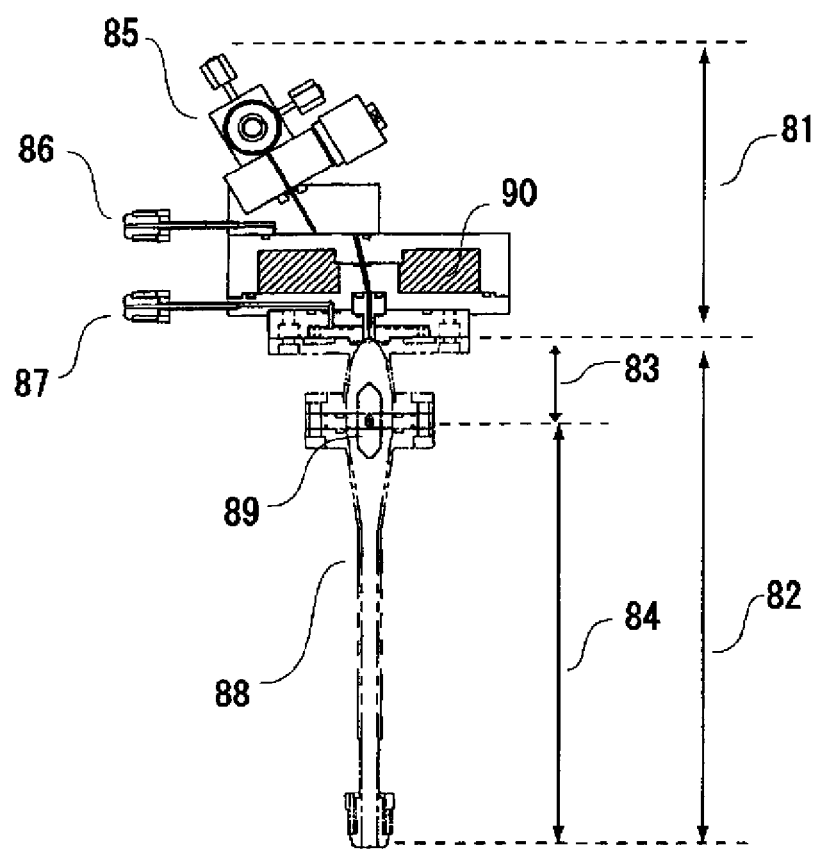
[FIG. 4] It is a cross section depicting the evaporating apparatus according to a specific embodiment of the present invention.

FIG. 4 is a cross section depicting the evaporating apparatus according to a specific embodiment of the present invention. In FIG. 4, across section depicting the overall evaporating apparatus is shown, which is formed of an evaporating head 81, and an evaporating pipe 82 in an evaporating unit 82 connected below the evaporating head. The evaporating pipe 88 is heated by a heater 89. Preferably, a heating temperature is at a temperature of 350° C. or above. Because the temperature of the raw material solution dispersed gas cooled near the gas outlet port of the issuing part is suddenly changed between the dispersing section and the evaporating unit, the gas is evaporated at the moment at which the gas comes out from the gas outlet port. The evaporated raw material is moved to the lower evaporating pipe, and brought into the depositing unit, not shown, and an MOCVD film is deposited onto a substrate. Liquid raw materials having different evaporation properties are mixed to select a suited evaporating temperature, whereby a plurality of raw materials can be stably supplied for evaporation under a single evaporation condition.

The gas passages carrying a carrier gas and a raw material solution through the passages are formed in the flat plate, and the flat plate is placed horizontally, whereby the height of the apparatus can be made lower. The issuing of a raw material solution into the gas passage may be conducted by spontaneous dropping because of gravity, or may be conducted by such a scheme that pressure is applied to a raw material solution tank to issue a raw material solution into the gas passage. When pressure is applied to the solution for issuing, it is unnecessary to arrange the raw material solution tank above the gas passage, and the tank can be arranged on the side of the gas passage or below the passage, which allows the height of the apparatus to be much lower.

In addition, in the specific embodiment shown in FIG. 6(a), the shape of the flat plate 101 is a disk shape. However, the shape is not necessarily a disk shape, and plates in given flat shapes can be used, including ellipses, rectangles, and polygons.

Figure 7:
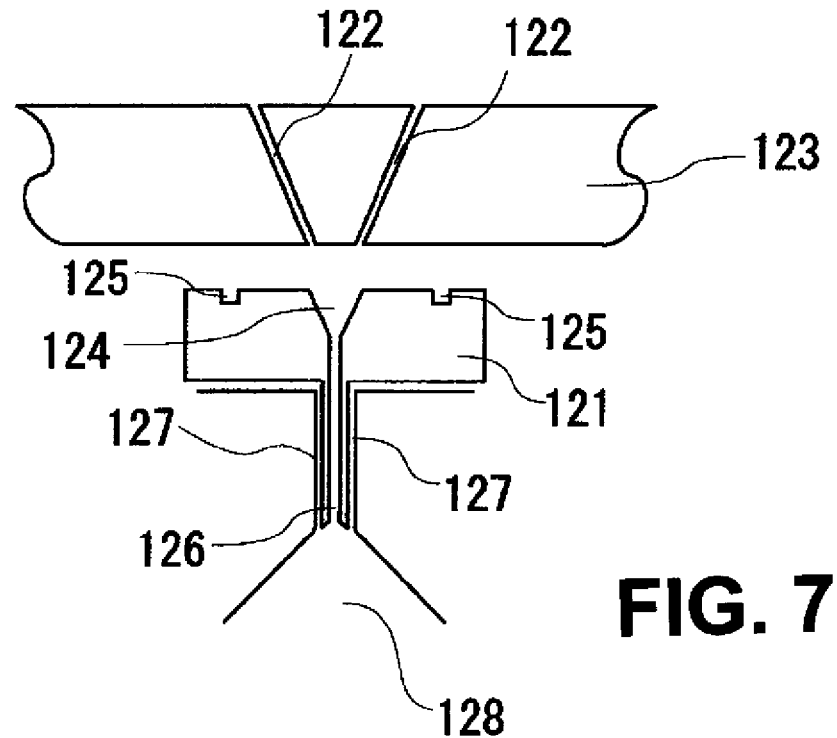
[FIG. 7] It is a cross section partially depicting an evaporating head of the evaporating apparatus according to a specific embodiment of the present invention.
Figure 8:
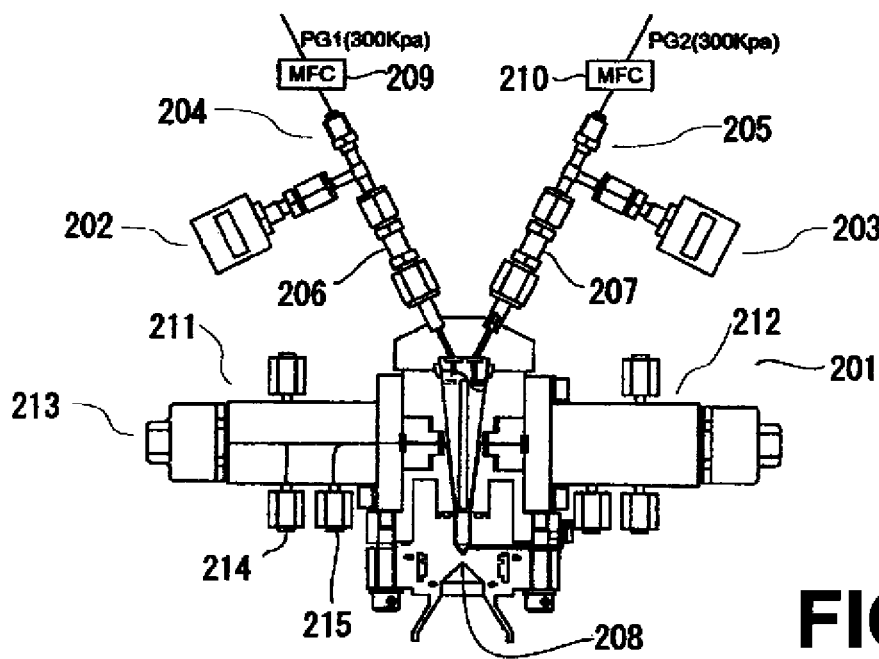
[FIG. 8] It is a cross section partially depicting an evaporating apparatus according to the background technique.

In FIG. 2, a jet nozzle 42 is mounted on a cooling plate 41 by fitting the projecting part of the nozzle into a recessed part formed on the plate. FIG. 7 is a cross section partially depicting the evaporating head of the evaporating apparatus according to the specific embodiment of the present invention. Because a mixture spray nozzle 121 is mounted as closely contacted with a cooling plate 123 through an O-ring seal 125, a raw material solution dispersed gas passing through a gas-solution mixing channel 122 and a conical mixing part 124 will not leak outside. The gas having passed through the gas passage is issued out from a jet nozzle 126 at the tip end of the mixture spray nozzle 121 into the evaporating pipe.

The processing accuracy and relative position accuracy of a plurality of gas outlet ports are determined by the processing accuracy of the mixture spray nozzle 121 and the processing accuracy of the groove parts, and the gas outlet ports can be formed highly accurately as compared with those according to the background technique that the positions of a plurality of tapered pipes are adjusted and mounted. Because the shape and relative position of the jet nozzle can be processed highly accurately, the ratio of flow rates of gases containing a plurality of raw materials can be accurately controlled, and high quality MOCVD films can be fabricated as stoichiometry, impurity contents, and compositions are controlled highly accurately. In addition, it is unnecessary to adjust the positions of pipes to be gas passages in the assembly process. In addition, a member in a conical shape is used to provide sufficiently high sealing effect with the use of a simple packing seal. Moreover, the evaporating apparatus can be repaired by only changing individual parts such as a flat plate and an evaporating head, and difficult positioning operations are unnecessary. Thus, maintenance costs can be reduced, and maintenance work can be made easier.

In this embodiment, the case is described in which the jet nozzle in a conical shape is used. However, the shape of the jet nozzle is not limited to a conical shape. As long as the shape is the shape projecting downward including pyramids such as a quadrangular pyramid and elliptic cones, advantages such as easy mounting can be obtained as similar to the case of using the jet nozzle in a conical shape.

Figure 3:
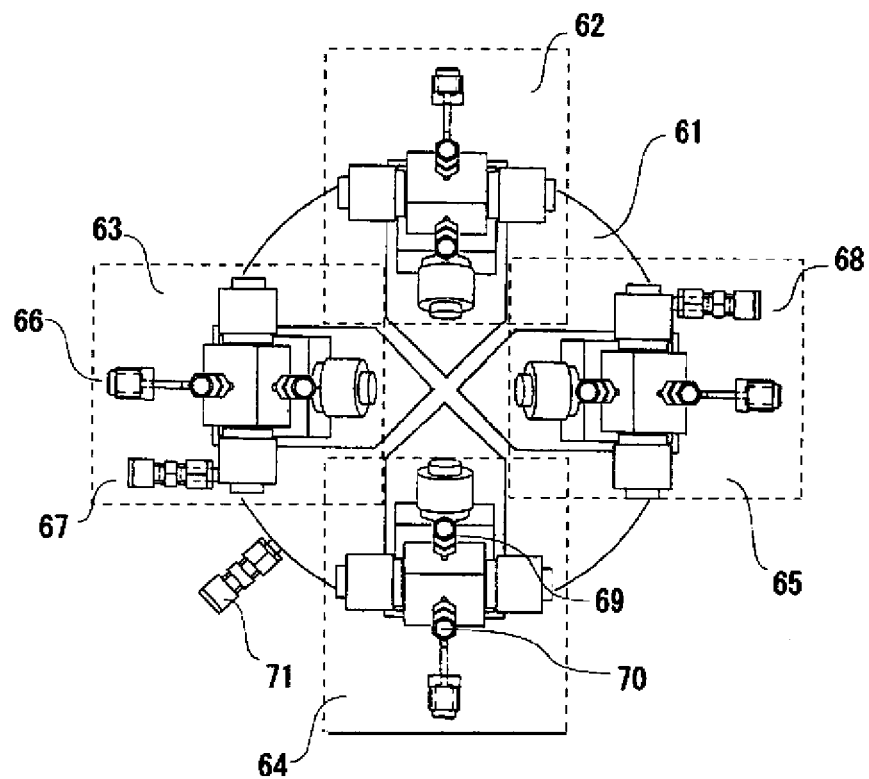
[FIG. 3] It is a plan view depicting the evaporating apparatus according to a specific embodiment of the present invention.

FIG. 3 is a plan view depicting the evaporating apparatus according to a specific embodiment of the present invention. The evaporating apparatus shown in FIG. 3 is a disk integrated mixing-evaporating apparatus. A plurality of three-way diverter valves is mounted on a disk-shaped integrated plate. A plurality of raw materials brought in from a plurality of inlet ports is mixed with each other within the tolerance under individual evaporation conditions, and collectively atomized and issued from the jet nozzle into the heated evaporating unit for instantaneous evaporation, whereby the ease of composition control and long term reproducibility can be maintained and ensured.

(Another Specific Embodiment of an Evaporating Apparatus)

FIG. 6(b) is a plan view depicting an evaporating apparatus according to another specific embodiment of the present invention. The evaporating apparatus according to this embodiment is characterized in that the shape of a gas passage 109 formed on an integrated plate 108 is a passage having a plurality of bends between a raw material solution inlet port 110 and a jet nozzle 112 that is the outlet port of a raw material solution dispersed gas, that is, a passage in a zigzag shape. The passage shape has a plurality of bends, whereby such an advantage is exerted that the effect of cooling a fluid can be enhanced. In addition, a large secondary swirl flow is induced in the passage to cause the flowing state of a gas-liquid two phase flow to be a more turbulent flow for promotion of finer liquid particles. At the same time, such advantages can be exerted that line pressure is increased, and the occurrence of bubbles in the liquid transport line is prevented to further stabilize the flow.

(System of Parallel Arrangement of Single Raw Material Evaporators)

In recent years, demands for a variety of functional thin films are increasing more and more. With this trend, the types of raw materials and methods of film deposition are diversified. Moreover, it is also desired to meet liquid materials of unique evaporation conditions, quick response on the supply side, use of evaporation gases unsuited for mixture before a reactor, processes for laying single films of different atoms, and the like.

Figure 5:
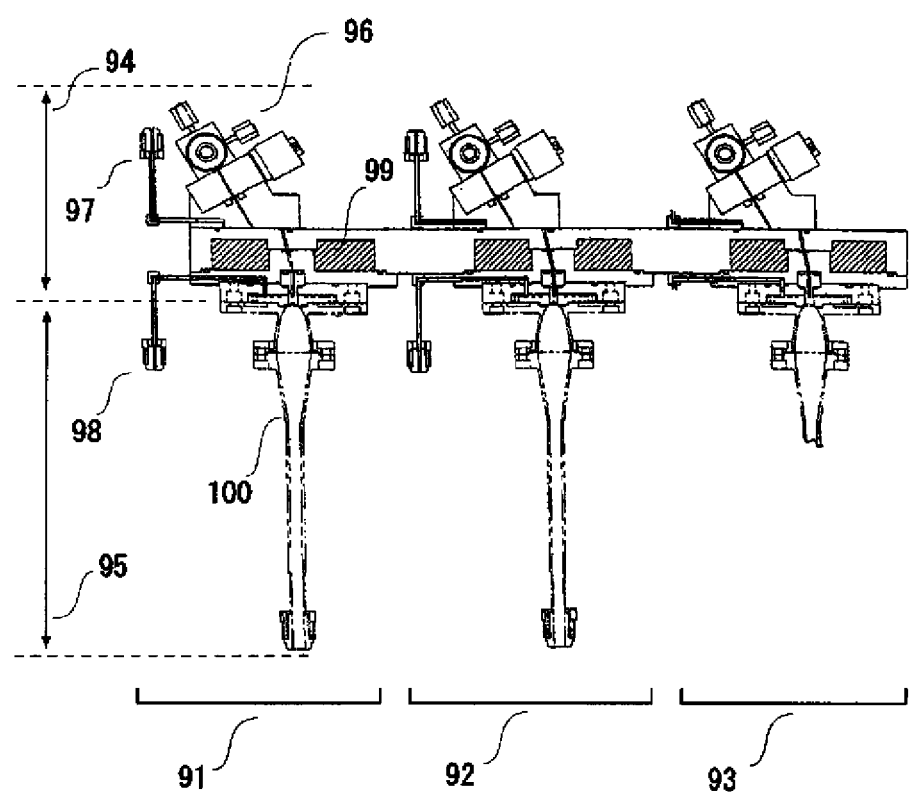
[FIG. 5] It is a cross section depicting the evaporating apparatus according to a specific embodiment of the present invention.

FIG. 5 is a modification of an evaporating apparatus for meeting these needs. An evaporating apparatus shown in FIG. 5 has a structure in which single raw material evaporators, each having a raw material introduction system, a flat plate provided with gas passages, and an evaporating pipe, are arranged in parallel with the use of a common flat plate. The parallel structure is constructed to allow readiness for evaporation gases unsuited for mixture before the reaction unit and for processes for laying different atoms.

(Applications of an MOCVD System)

An MOCVD system using the evaporating apparatus according to the present invention can be used for fabricating insulating films for next-generation DRAMs as well as used for fabricating insulating films for a large capacity FeRAM (Ferromelectric Ramdom Access Memory) and gate insulating films for micro MOSFETs, for example. In the past, for fabrication of ferroelectric films for FeRAMs, the films are usually fabricated according to sputtering methods. However, the composition of a film cannot be changed to cause a problem of low step coverage. In accordance with the MOCVD system according to the present invention, operations can be conducted continuously, the stoichiometry of a deposited film can be accurately controlled, and ferroelectric films of higher quality can be produced at mass production level. In addition, also for wiring metal films and barrier metals that are deposited by sputtering methods, these films are replaced by MOCVD films, whereby met al films of excel lent coverage can be formed at high speed.

(Applications to Systems Other than the MOCVD System)

The case is described in which the evaporating apparatus according to the present invention is used in the film deposition system for MOCVD films. However, the evaporating apparatus according to the present invention can be used for such film deposition systems that these systems are as long as the systems in which a raw material solution is dissolved in a solvent, heated and evaporated for depositing a film. The similar advantages can be obtained as those of the apparatus for fabrication MOCVD films. For example, the evaporating apparatus can be used in an ALD (atomic later deposition apparatus).

INDUSTRIAL APPLICABILITY

According to the present invention, an MOCVD evaporating apparatus can be provided, which is capable of uniformly cooling a carrier gas mixed with a raw material solution at high cooling efficiency

The invention claimed is:

1. An evaporating apparatus including an evaporating head, wherein a dispersion section is located within the evaporating head and an evaporating unit,
    the dispersing section being configured for bringing in a carrier gas from one end of a gas passage and delivering a carrier gas containing a raw material solution from an issuing part arranged at the other end of the gas passage to an evaporating unit for evaporation, the apparatus comprising:
    a flat plate on which a plurality of the gas passages are radially arranged around the issuing part; and
    means for cooling at least one of the plurality of gas passages,
    wherein each of the gas passages is formed as a groove part on a surface of the flat plate and is covered by one or several adjacent members to form a closed passage, and the raw material solution is issued into the carrier gas in a midway of the gas passages on the flat plate, and the carrier gas shears the raw material solution to change the raw material solution to mist for dispersing the raw material solution in the carrier gas.

2. The evaporating apparatus according to claim 1, wherein a shape of a lower portion of the issuing part is a conical shape projecting downward, and the means for cooling is a cooling plate with which a mixture spray nozzle is mounted closely contacted through an O-ring seal.

3. The evaporating apparatus according to claim 2, wherein the gas passage has a plurality of bends on the flat plate.

4. A film deposition system having the evaporating apparatus according to claim 2.

5. The evaporating apparatus according to claim 1, wherein a cooling temperature of the means for cooling ranges from 0° C. to 35° C.

6. The evaporating apparatus according to claim 5, wherein the gas passage has a plurality of bends on the flat plate.

7. A film deposition system having the evaporating apparatus according to claim 5.

8. The evaporating apparatus according to claim 1, wherein the gas passage has a plurality of bends on the flat plate.

9. A film deposition system having the evaporating apparatus according to claim 8.

10. A film deposition system having the evaporating apparatus according to claim 1.

11. The film deposition system according to claim 10, wherein the film deposition system is an MOCVD system.

12. The evaporating apparatus according to claim 1, wherein the cooling device is a cooling plate.

13. An evaporating apparatus including an evaporating head and an evaporating, wherein a dispersion section is located within the evaporating head unit,
    the dispersing section comprising:
    a plurality of gas passages, each gas passage being configured for bringing in a carrier gas from one end of the gas passage and delivering a carrier gas containing a raw material solution from an issuing part arranged at the other end of the gas passage to the evaporating unit for evaporation;
    a flat plate on which the plurality of the gas passages are radially arranged around the issuing part; and
    a cooling device configured for cooling at least one of the plurality of gas passages,
    wherein each of the gas passages is formed as a groove part on a surface of the flat plate and is covered by one or several adjacent members to form a closed passage, and the raw material solution is issued into the carrier gas in a midway of the gas passages on the flat plate, and the carrier gas shears the raw material solution to change the raw material solution to mist for dispersing the raw material solution in the carrier gas.

* * * * *

UNITED STATES PATENT AND TRADEMARK OFFICE
CERTIFICATE OF CORRECTION

PATENT NO.       : 8,486,196 B2
APPLICATION NO.  : 12/601314
DATED            : July 16, 2013
INVENTOR(S)      : Toda et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 345 days.

Signed and Sealed this
Eighth Day of September, 2015

Michelle K. Lee
*Director of the United States Patent and Trademark Office*